(12) United States Patent
Park et al.

(10) Patent No.: US 7,806,982 B2
(45) Date of Patent: Oct. 5, 2010

(54) APPARATUS FOR FABRICATING ELECTROLUMINESCENT DISPLAY DEVICE

(75) Inventors: Chong Hyun Park, Daegu (KR); Yoon Heung Tak, Gumi (KR)

(73) Assignee: LG Display Co., Ltd., Seoul (KR)

( * ) Notice: Subject to any disclaimer, the term of this patent is extended or adjusted under 35 U.S.C. 154(b) by 945 days.

(21) Appl. No.: 11/378,320

(22) Filed: Mar. 20, 2006

(65) Prior Publication Data

US 2006/0213442 A1   Sep. 28, 2006

(30) Foreign Application Priority Data

Mar. 22, 2005 (KR) .................. 10-2005-0023846

(51) Int. Cl.
*C23C 16/00* (2006.01)
*C23C 16/04* (2006.01)

(52) U.S. Cl. ...................... 118/720; 118/504

(58) Field of Classification Search ............ 118/720, 118/721, 500, 503–505
See application file for complete search history.

(56) References Cited

U.S. PATENT DOCUMENTS 5,162,008 A * 11/1992 Steiner et al. ............. 445/30
2006/0213442 A1 * 9/2006 Park et al. .................. 118/720
2006/0217023 A1 * 9/2006 Park et al. .................. 445/24

FOREIGN PATENT DOCUMENTS

KR     20-1999-005475     2/1999

* cited by examiner

*Primary Examiner*—Jeffrie R Lund
(74) *Attorney, Agent, or Firm*—Morgan Lewis & Bockius LLP

(57) ABSTRACT

The apparatus for fabricating an organic electroluminescent device which can distribute stress applied to the mask uniformly to form precise and reliable light emitting layers is disclosed. The apparatus for fabricating an electroluminescent device according to the present invention comprises a plurality of grippers disposed in a zigzag state at a periphery of a mask for clamping the mask, a plurality of jaws formed on each gripper and contacting with the mask, and power supplying units for supplying power to the grippers to stretch the mask. Each of the grippers is divided into a connecting section connected to the power supplying unit and a head section integrated into the connecting section, and a plurality of jaws are formed on the head section of each gripper, and odd (or even)-numbered grippers disposed at each side of the mask are disposed in a more forward position than even (or odd)-numbered grippers. Accordingly, the head section of each even (or odd)-numbered gripper is placed between the connection sections of two adjacent odd (or even)-numbered grippers. The head sections of even-numbered grippers and the head sections of odd-numbered grippers are arranged alternatively in two different imaginary lines. Also, the jaws are arranged in a line on the head section of each gripper or are arranged in a zigzag state on the head section of each gripper. At this time, the jaws are arranged by equal distance from each other.

7 Claims, 4 Drawing Sheets

APPARATUS FOR FABRICATING ELECTROLUMINESCENT DISPLAY DEVICE

BACKGROUND OF THE INVENTION

1. Field of the Invention

The present invention relates to an apparatus for fabricating an electroluminescent display device, particularly to an apparatus for fabricating an electroluminescent display device capable of distributing a stress applied to a mask uniformly to form a precise and reliable pixel.

2. Description of the Related Art

Recently, various kinds of flat display devices having less weight and volume have been developed to substitute the cathode ray tube (CRT) having huge weight volume. Liquid crystal display device, field emission display device, plasma display panel and electro-luminescence display device (hereinafter, referred to as "EL" display device) are the examples of such flat display devices.

Among these flat display devices, the EL display device is a self-light emitting device in which light is emitted from fluorescent material by re-combining holes with electrons. The EL display device is classified into non-organic EL display device using nor-organic material as fluorescent material and organic EL display device using organic material as fluorescent material.

Compared with a passive light emitting device requiring additional light source such as liquid crystal display device, the EL display device is advantageous in that the response time is short to the same level as the cathode ray tube. Also, the EL display device has many advantages such as low-voltage drive, self-light emission, thin film shape, wide view angle, short response time, high contrast and the like, and so is expected to be the next generation display device.

FIG. 1 is a sectional view showing the structure of general organic EL cell for illustrating a light-emitting principle of organic EL display device. The organic EL cell comprises an organic light-emitting layer 110 disposed between an anode 104 and a cathode 112, the organic light emitting layer 110 consists of an electron injection layer 10a, an electron transport layer 10b, an light emitting layer 10c, a hole transport layer 10d and a hole injection layer 10e.

Once power voltage is applied to the anode 104 and the cathode 112, electrons generated from the cathode 112 are transported toward the light emitting layer 10c through the electron injection layer 10a and the electron transport layer 10b. Also, holes generated from the anode 104 are transported toward the light emitting layer 10c through the hole injection layer 10e and the hole transport layer 10d. Accordingly, electrons supplied through the electron transport layer 10b are collided and re-combined with holes supplied through the hole transport layer 10d in the light emitting layer 10c, and so and the light is emitted. This light is radiated to an exterior through the anode 104 to display an image.

FIG. 2 is a view showing the organic EL display device.

In the organic EL display device shown in FIG. 2, first electrodes 104 (hereinafter, referred to as "anodes") and second electrodes 112 (hereinafter, referred to as "cathodes") are formed on a substrate 102 in a crossing direction each other.

The anodes 104 are formed on the substrate 102 by certain distance from each other. On the substrate 102 on which the anodes 104 are formed, an insulating layer (not shown) having a plurality of openings is formed, wherein each opening corresponds to an EL cell area. Walls 108 are formed on the insulating layer to divide the organic light emitting layers 110 and the cathodes 112 formed thereon. Each wall 108 is formed in the direction perpendicular to the anodes 104, and has an inverse taper structure in which the upper end side is larger than the lower end side.

After the walls 108 are formed on the insulating layer, the organic light emitting layers 110 made of organic material and the cathodes 112 are sequentially formed on the entire insulating layer. As shown in FIG. 1, the hole injection layer 10c, the hole transport layer 10d, the light emitting layer 10c, the electron transport layer 10b and the electron injection layer 10a are sequentially formed to form each organic light emitting layer 110.

Here, red (R) colored light-emitting layer, green (G) colored light-emitting layer and blue (B) colored light-emitting layer are formed on the EL cell areas by using a stretched mask provided in the manufacturing apparatus.

The light emitting layer 10c of the organic EL display device shown in FIG. 1 is is formed through thermal deposition and vacuum deposition processes using a grill mask. The grill mask has a plurality of grills formed thereon and corresponding to the light emitting layers to be formed on the substrate. The manufactured grill mask is stretched by a mask clamping/stretching apparatus into a predetermined dimension, and then fixed to a mask frame of the manufacturing apparatus.

In the process for forming the light emitting layer, the mask fixed to the mask frame is placed on a surface of the substrate, and so the light emitting layer 10c is formed on a surface of the substrate corresponding to the grill formed on the mask.

A plurality of grippers are mounted to the mask clamping/stretching apparatus. By pulling the grippers in the state that mask is gripped with the grippers, the mask is stretched. In this process, a stress is applied onto portions corresponding to each gripper in a periphery of the mask. If the magnitude of stress applied to one portion of the mask differs from that applied to another portion for some reasons, the magnitude of tension force applied to one grill differs from that applied to other grills depending on a position of the grill. As a result, the stretching amounts of the grills cannot but differ from each other.

If the stretching amounts of the grills differ from each other, sizes (areas) of the light emitting layers formed by the grills of the mask also become different from each other. Accordingly, each light emitting layer is not formed correctly on the predetermined position, and sizes (areas) of the light emitting layers in the display device are different from each other.

SUMMARY OF THE INVENTION

The present invention intends to solve the above problem occurred in the course of forming the light emitting layer. Thu the object of the present invention is to provide an apparatus for fabricating an organic electroluminescent device which can distribute stress applied to the mask uniformly to form precise and reliable light emitting layers.

For achieving the above objects, the apparatus for fabricating an electroluminescent device according to the present invention comprises a plurality of grippers disposed in a zigzag state at a periphery of a mask for clamping the mask, a plurality of jaws formed on each gripper and contacting with the mask, and power supplying units for supplying power to the grippers to stretch the mask.

Each of the grippers is divided into a connecting section connected to the power supplying unit and a head section integrated into the connecting section, and a plurality of jaws are formed on the head section of each gripper, and odd (or even)-numbered grippers disposed at each side of the mask are disposed in a more forward position than even (or odd)- numbered grippers. Accordingly, the head section of each even (or odd)-numbered gripper is placed between the connection sections of two adjacent odd (or even)-numbered grippers.

The head sections of even-numbered grippers and the head sections of odd-numbered grippers are arranged alternatively in two different imaginary lines.

Also, the jaws are arranged in a line on the head section of each gripper or are arranged in a zigzag state on the head section of each gripper. At this time, the jaws are arranged by equal distance from each other.

BRIEF DESCRIPTION OF THE DRAWINGS

The present invention will be more clearly understood from the detailed description in conjunction with the following drawings.

DETAILED DESCRIPTON OF THE INVENTION

Hereinafter, the preferred embodiment of the present invention will be described in detail with reference to those accompanying drawings.

Figure 1:
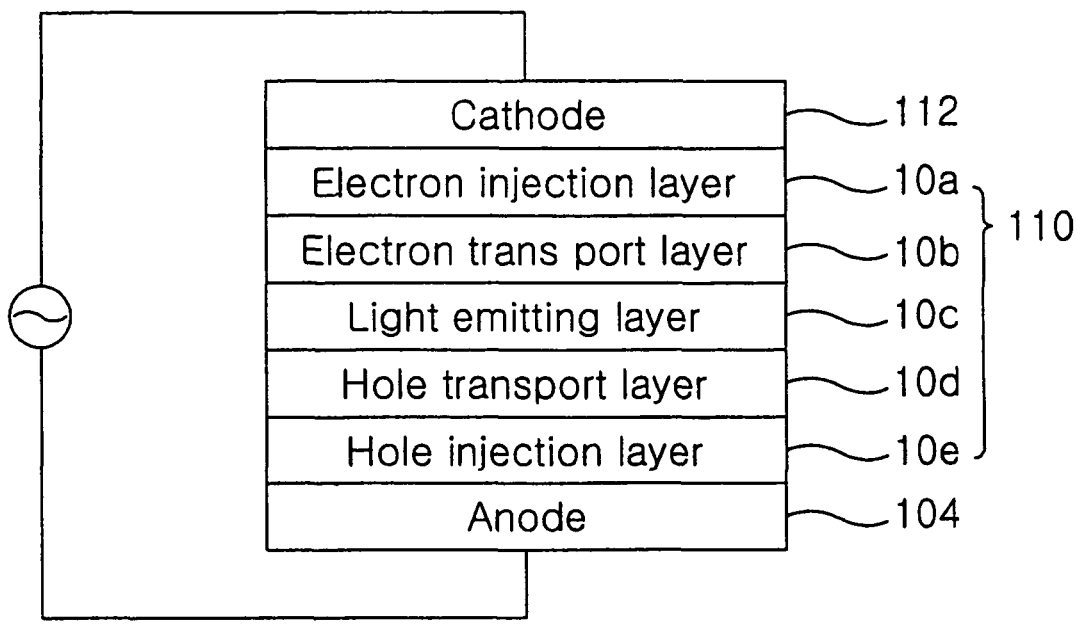
FIG. 1 is a view illustrating one pixel of a conventional organic electroluminescent display device.
Figure 2:
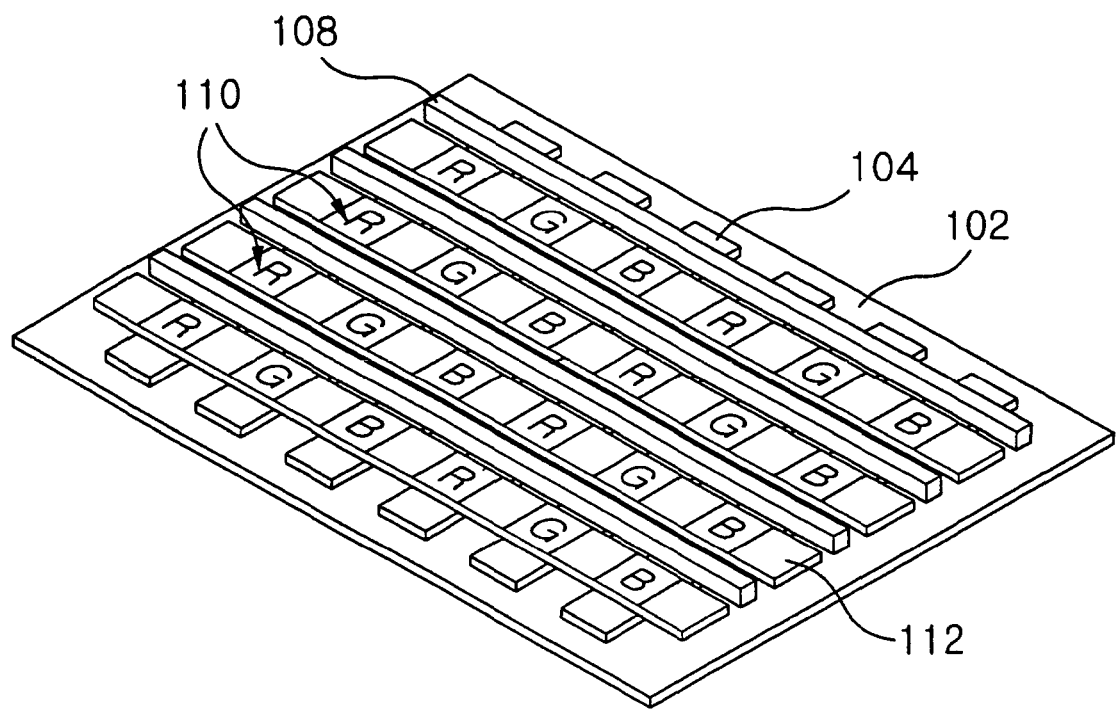
FIG. 2 is a view showing the organic electroluminescent display device.
Figure 3:
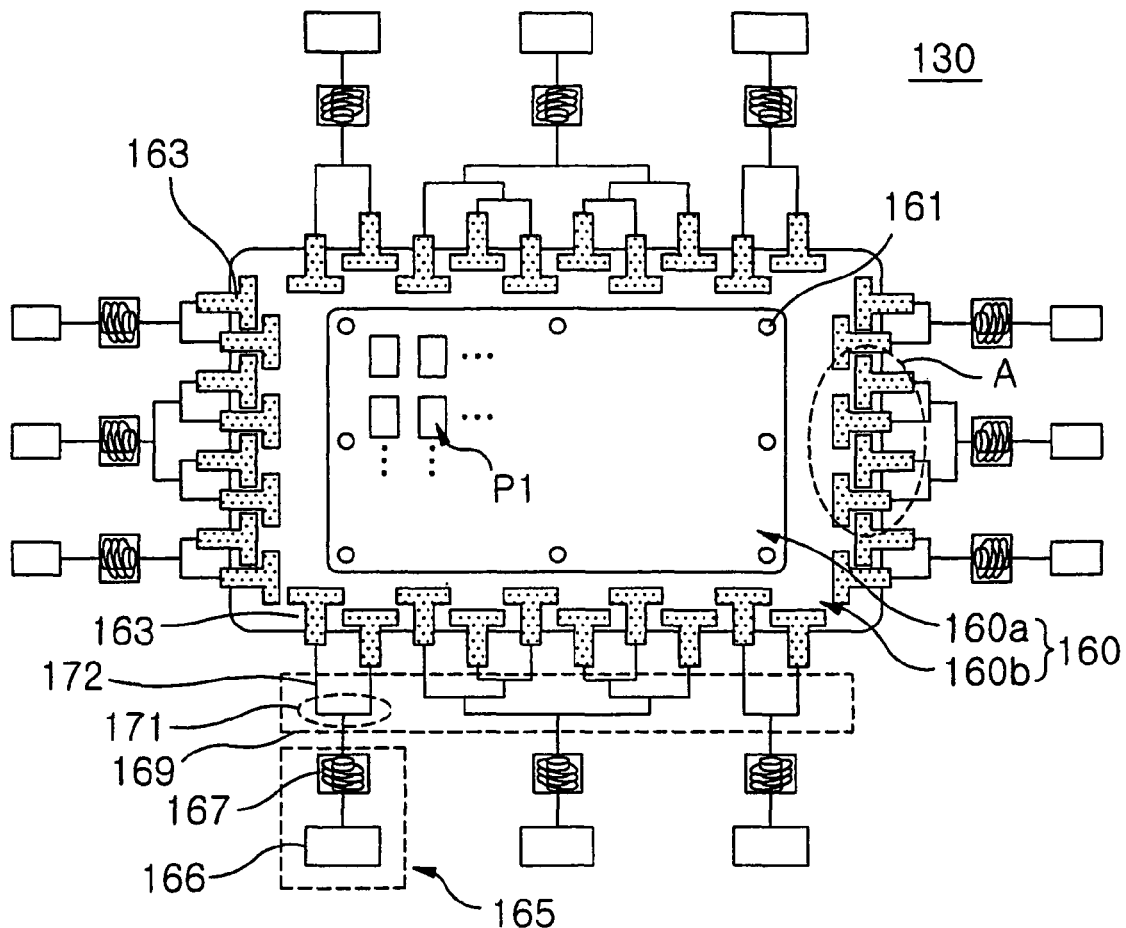
FIG. 3 is a view showing an apparatus for fabricating an organic electroluminescent display device according to the present invention.

FIG. 3 is a view showing a portion of the apparatus for fabricating the organic EL display device, that is, a mask clamping/stretching apparatus according to the present invention.

The mask clamping/stretching apparatus 130 shown in FIG. 3 comprises grippers 163 disposed at long sides and short sides of a mask 160 to grip the mask; power supplying units 165 for supplying the power to enable the mask 160 to be stretched; and power transmission units 169 installed for transmitting the power supplied from the power supplying units 165 to the grippers 163. Such mask clamping/stretching apparatus 130 is supported by a clamp holder (not shown).

The mask 160 is a grill mask used for forming the R (red), G (green) and B (blue) light emitting layers 10 of the organic EL display device, and is divided into an effective area 160a and a non-effective area 160b except the effective area 160a. A plurality of array areas P1 are formed on the effective area 160a, and the substrate (not shown) is selectively exposed through the array areas P1 to form the light emitting layers 160 of R (red). G (green) and B (blue) pixels. Also, a plurality of points 161 are formed on an outer periphery of the effective area 160a to provide a bases when the mask 160 is stretched. That is, a user decides a stretching limit on the basis of the points 161 marked on the mask 160, and the mask 160 is then stretched by a force corresponding to the stretching limit. The non-effective area 160b is a periphery area of the mask 160 except the effective area 160a, and the grippers 163 grip the non-effective area 160b so that a tension force is applied first to the non-effective area 160b when the mask is stretched.

For example, about ten (10) grippers 163 (gripper group) are disposed at each long side of the mask 160, and about eight (8) grippers (gripper group) are disposed at each short side of the mask. Also, an adjusting screw is mounted to each gripper 163 for adjusting a frictional resistance of the gripper 163.

As shown in FIG. 3, three power supplying units 165 are disposed at each side of the mask 160, and each of power supplying units 165 consists of a motor 166 coupled with the power transmission unit 160 and a ball screw box 167 coupled with the motor 166 for converting a rotational motion of the motor 166 into a linear motion.

Each power transmission unit 169 comprises connecting levers 171 coupled to the ball screw box 167 of the power supplying unit 165 rand connecting pins 172 coupled to the connecting levers 171. Each gripper 163 is coupled with each connecting pin 172.

Figure 4:
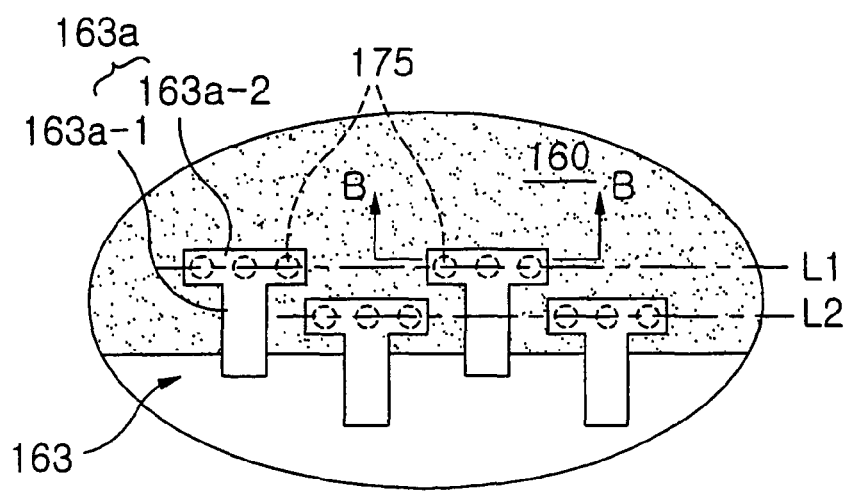
FIG. 4 is an enlarged view of "A" section of FIG. 3.

FIG. 4 is an enlarged view of "A" section of FIG. 3, and shows the arrangement of the grippers 163.

The grippers 163 are arranged in a zigzag state by equal distance from each other. On the other hand, the upper section 163a of each gripper 163 is divided into a connection section 163a-1 coupled with the corresponding power transmission unit 169 and a head section 163a-2 integrated into the connection section 163a-1. As shown in FIG. 3 and FIG. 4, the width of the head section 163a-2 is bigger than that of the connection section 163a-1, and the head sections 163a-2 of all the grippers 163 correspond to the mask 100. Here, the lower section 163b of each gripper 163 has the same configuration as that of the upper section 163a.

The head sections 163a-2 of the grippers 163 disposed at each side of the mask 160 are also arranged in the zigzag state. That is, for example, odd (or even)-numbered grippers 163 are disposed in a more forward position than the even (or odd)-numbered grippers. Accordingly, the head section 163a-2 of each even (or odd)-numbered gripper 163 is placed between the connection sections 163a-1 of two adjacent odd (or even) numbered grippers 163.

Figure 5:
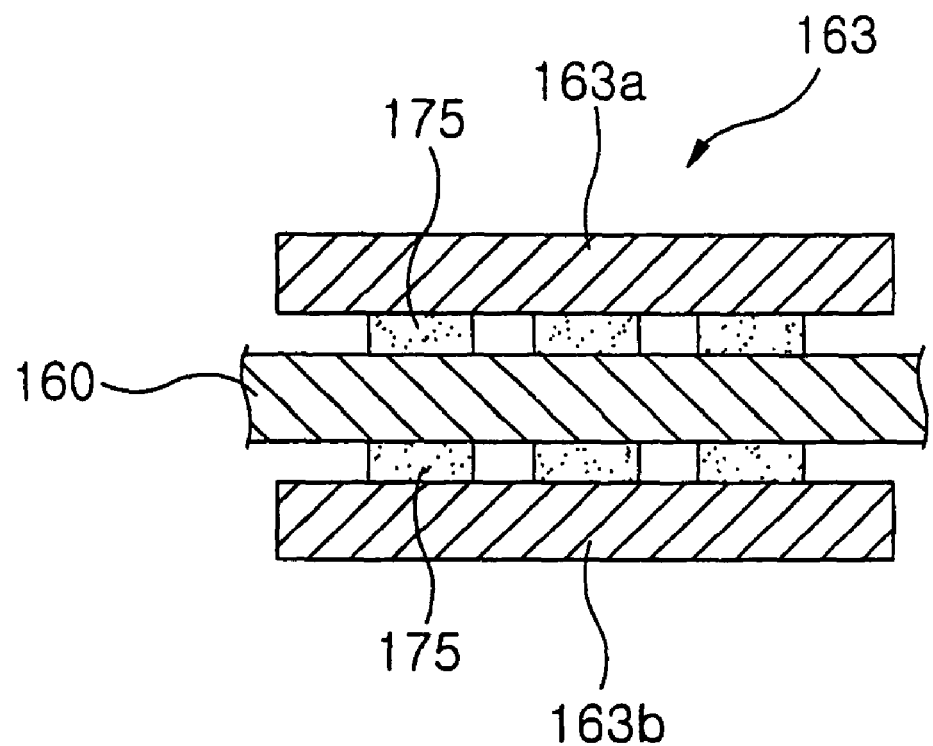
FIG. 5 is a sectional view taken along a line B-B in FIG. 4.

Due to such arrangement of the grippers 163, the head sections 163a-2 of the grippers 163 with a larger width are arranged alternatively in two different imaginary lines L1 and L2, and a space between the two adjacent grippers 163 can be remarkably reduced FIG. 5 is a sectional view taken along line B-B in FIG. 4, and shows that each gripper 163 consists of an upper section 163aand a lower section 163b facing the upper section.

As shown in FIG. 4 and FIG. 5, three (3) or more jaws 175 each are formed on inside surfaces of the head sections of the upper section 163aand the lower section 163b. Each jaw 175 is placed between the upper section 163a/the lower section 163b and the mask 160 to transmit the power transmitted to the gripper 163 to the mask 160.

As described above, the head sections 163a-2 of the grippers 163 are arranged alternatively in two different imaginary lines L1 and L2, and the width of each head section 163a-2 is larger than that of the connecting section 163a-1, and so an area (that is, the area of head section) on which the jaws 175 are disposed becomes wide.

That is, compared with the grippers having a rod shape without a head section and the state that the sections of the grippers on which the jaws are formed are arranged in a line, the grippers and the arrangement of the grippers as shown in FIG. 4 and FIG. 5 are advantageous in that a space between the two adjacent grippers 163 is remarkably reduced, and much more jaws 175 can be formed on the head section 163a-2 of each gripper 163, and so a plurality of jaws 175 formed on the head sections 163a-2 of the grippers 163 are contacted densely and uniformly with the mask 160 through the entire non-effective area 160b. Consequently, it is possible to prevent the stress from being concentrated on a specific area of the mask 160.

Figure 6:
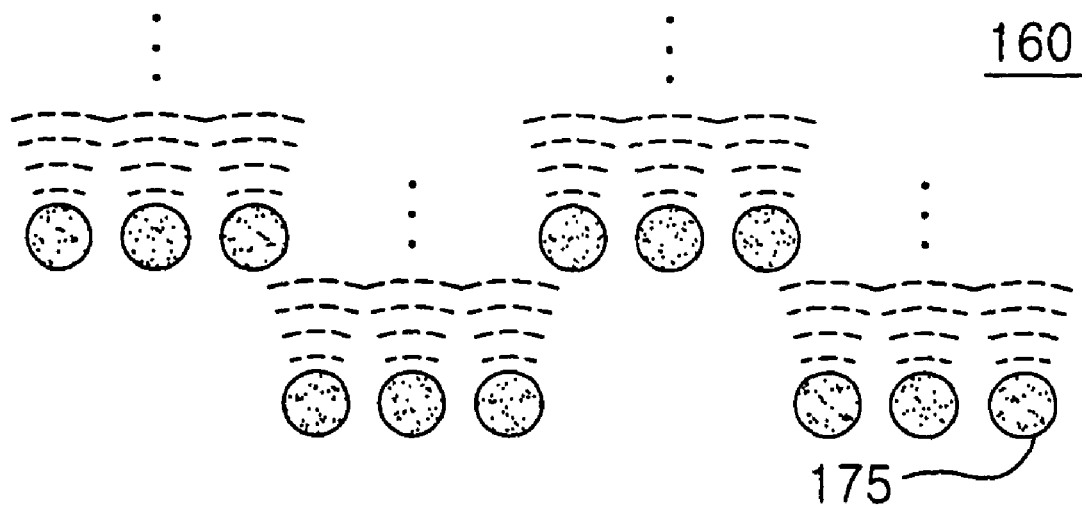
FIG. 6 is a schematic view illustrating an even distribution of stress caused by a plurality of the jaws on the mask shown in FIG. 4.

FIG. 6 is a schematic view illustrating even distribution of stress caused by a plurality of jaws on the mask shown in FIG. 4. As shown in FIG. 6, the stress applied to the mask 160 is uniformly distributed on the entire area of the mask 160 so that the mask and all the grills formed on the mask are uniformly stretched.

Figure 7:
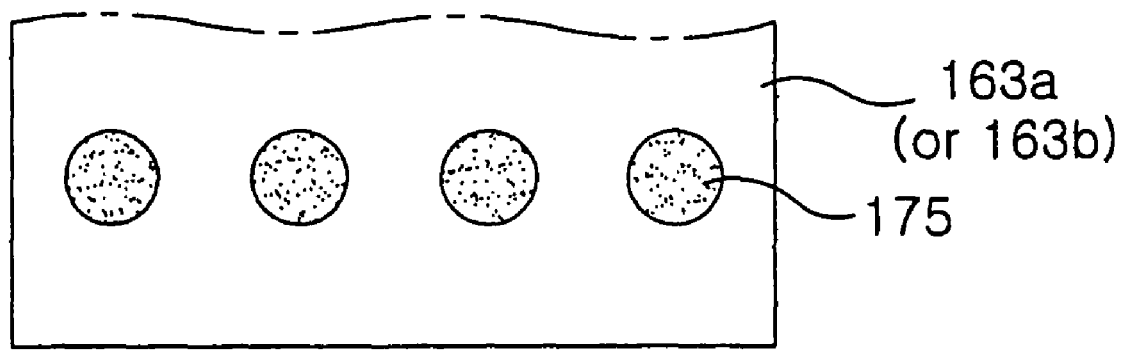
FIG. 7 and FIG. 8 are views showing various arrangement states of the jaws.
Figure 8:
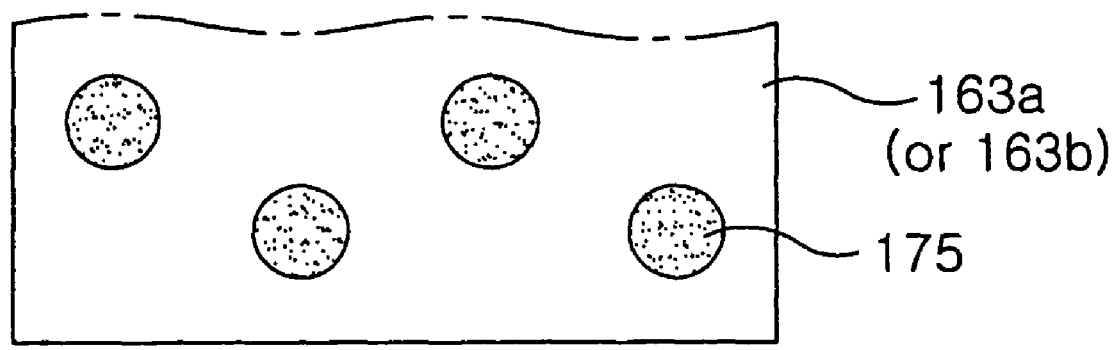

FIG. 7 and FIG. 8 are views showing various arrangement states of the jaws, the jaws 175 formed on each gripper 163 can be arranged in a line as shown in FIG. 7 and, and can be arranged in the zigzag state as shown in FIG. 8. Also, the jaws can be randomly arranged. In addition, the jaws 175 formed on each gripper 163 are arranged by equal distance from each other.

The mask clamping/stretching apparatus 130 having the above structure is operated as follows.

First, after the mask 160 is loaded on a certain system, the mask is arranged at an area where the grippers 163 are placed, by a vertical movement.

Thereinafter, the grippers 163 are moved forward to clamp the mask 160, and the motors 166 are driven. A rotational motion of each motor 166 is converted into a linear motion through each ball screw box 167, and then transmitted to a corresponding power transmission unit 169.

At this time, once each power transmission unit 169 to which the power of the motors 166 is transmitted is moved backward, the grippers 163 are also moved backward. Accordingly, the mask 160 contacting with the jaws 175 of each gripper 163 is stretched outward by the grippers 163.

Then, once the mask 160 is stretched and expanded to a designed size, a mask frame (not shown) is disposed below the mask 160, and then the mask 160 is fixed to the mask frame by laser welding. The mask 160 fixed to the mask frame is used in the process of forming the light emitting layer. That is, the mask frame to which the mask 160 is fixed is placed below the substrate, and organic material vapor is passed selectively through the grills formed on the mask 160 and reaches a predetermined light emitting area of the substrate. Accordingly, the organic light emitting layer pattern corresponding to the grills of the mask 160 is formed on the substrate.

As described above, in the apparatus for fabricating an organic electroluminescent display device according to the present invention, the grippers provided for clamping the mask are disposed in the zigzag state, each gripper has the head section with a relatively large width, and a plurality of jaws are formed on the head section of each gripper. Thus, it is possible to prevent the stress from being concentrated on a specific area of the mask, and distribute the stress uniformly on the mask and all the grills formed on the mask.

Consequently, the light emitting layer can be formed precisely on a predetermined area of the substrate by using the mask which is uniformly stretched, thereby enhancing reliability of the organic electroluminescent display device.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. An apparatus for fabricating an electroluminescent display device, comprising:
   a plurality of grippers disposed in a zigzag state at a periphery of a mask for clamping the mask;
   a plurality of jaws formed on each gripper and contacting with the mask; and
   power supplying units for supplying power to the grippers to stretch the mask,
   wherein each of the grippers is divided into a connecting section connected to the power supplying unit and a head section integrated into the connecting section, a plurality of jaws are formed on the head section of each gripper, and a width of the head section is larger than a width of the connecting section.

2. The apparatus for fabricating an electroluminescent display device according to claim 1, wherein the mask has a plurality of grills, and is used for fabricating an organic electroluminescent display device.

3. The apparatus for fabricating an electroluminescent display device according to claim 2, wherein the grills formed of the mask correspond to light emitting areas of a substrate to form light emitting layers of R (red), G (green) and B (Blue) pixels of the organic electroluminescent display device.

4. The apparatus for fabricating an electroluminescent display device according to claim 1, further comprising power transmitting units, each power transmitting unit being provided between the gripper group arranged on each side of the mask and the corresponding power supplying unit to enable the grippers to be moved linearly.

5. The apparatus for fabricating an electroluminescent display device according to claim 1, wherein odd (or even) numbered grippers disposed at each side of the mask are disposed in a more forward position than even (or odd) numbered grippers.

6. The apparatus for fabricating an electroluminescent display device according to claim 5, wherein the head section of each even (or odd)-numbered gripper is placed between the connection sections of two adjacent odd (or even)-numbered grippers.

7. The apparatus for fabricating an electroluminescent display device according to claim 6, wherein the head sections of even-numbered grippers and the head sections of odd-numbered grippers are arranged alternatively in two different lines.

* * * * *